United States Patent
Trittschuh, III et al.

(10) Patent No.: US 9,337,638 B2
(45) Date of Patent: May 10, 2016

(54) CLAMP MECHANISM FOR POWER DISTRIBUTION LINE SENSORS

(71) Applicant: Grid Sentry LLC, Beavercreek, OH (US)

(72) Inventors: Everett P. Trittschuh, III, Lewisburg, OH (US); Christopher R. Collins, Piqua, OH (US)

(73) Assignee: GRID SENTRY LLC, Beavercreek, OH (US)

( * ) Notice: Subject to any disclaimer, the term of this patent is extended or adjusted under 35 U.S.C. 154(b) by 454 days.

(21) Appl. No.: 13/752,730

(22) Filed: Jan. 29, 2013

(65) Prior Publication Data

US 2014/0209352 A1   Jul. 31, 2014

(51) Int. Cl.
| | |
|---|---|
| *H02G 7/00* | (2006.01) |
| *G01R 15/18* | (2006.01) |
| *B25B 5/04* | (2006.01) |
| *B25B 5/10* | (2006.01) |
| *B25B 5/16* | (2006.01) |

(52) U.S. Cl.
CPC ... *H02G 7/00* (2013.01); *B25B 5/04* (2013.01); *B25B 5/10* (2013.01); *B25B 5/166* (2013.01); *G01R 15/18* (2013.01)

(58) Field of Classification Search
CPC ............. F16B 2/10; B25B 5/10; B25B 5/163; B25B 5/103; B25B 5/166; B25B 5/00; B25B 5/05; H02G 7/00; G01R 15/26
USPC .......................... 269/220, 237, 242, 243, 245; 248/229.13, 229.23, 226.12, 229.1, 248/228.4, 231.51; 174/135; 324/126, 127; 340/538
See application file for complete search history.

(56) References Cited

U.S. PATENT DOCUMENTS

| | | | | |
|---|---|---|---|---|
| 1,423,933 | A | * 7/1922 | Heatlie | .......................... 269/218 |
| 3,665,357 | A | 5/1972 | Tsubouchi et al. | |
| 4,278,246 | A | * 7/1981 | Blake | .............................. 269/220 |
| 4,296,376 | A | 10/1981 | Bartol, Jr. | |
| D281,856 | S | * 12/1985 | Hamatani | ......................... D8/51 |
| 4,583,713 | A | * 4/1986 | Fukura et al. | ................. 254/126 |
| 4,698,740 | A | 10/1987 | Rodgers | |
| 4,723,220 | A | 2/1988 | Smith-Vaniz | |
| 4,799,005 | A | 1/1989 | Fernandes | |
| 4,799,639 | A | * 1/1989 | Riley | ......................... 248/228.4 |

(Continued)

*Primary Examiner* — Tan Le
(74) *Attorney, Agent, or Firm* — Thompson Hine LLP

(57) ABSTRACT

A clamp mechanism for a power distribution line sensor including a drive rod having a first rod portion with a spiral thread formed in a first-handed thread direction, a second rod portion with a spiral thread formed in an opposite-handed thread direction, and a coupling end portion. The mechanism also includes a first clamp portion having a first drive block engaged with the first rod portion and a first clamp arm having a pin-in-slot connection to that drive block, as well as a second clamp portion having a second drive block engaged with the second rod portion and a second clamp arm having a pin-in-slot connection to that drive block. The first clamp arm and the second clamp arm are secured to each other, yet rotatable with respect to each other, at a proximal end of each respective clamp arm. A clamp block may function as part of the securement.

20 Claims, 5 Drawing Sheets

(56) References Cited

U.S. PATENT DOCUMENTS

| | | | |
|---|---|---|---|
| 4,897,600 A | 1/1990 | Hagmann et al. | |
| D362,197 S | 9/1995 | Fujino | |
| 5,764,123 A | 6/1998 | Waters | |
| 5,942,964 A | 8/1999 | Takeuchi | |
| 5,971,378 A * | 10/1999 | Sweeney | 269/6 |
| 6,756,776 B2 | 6/2004 | Perkinson et al. | |
| 6,879,232 B2 | 4/2005 | Mayfield | |
| 7,106,162 B2 | 9/2006 | Saito | |
| 7,257,895 B2 * | 8/2007 | Makkonen et al. | 269/242 |
| 7,312,686 B2 | 12/2007 | Bruno | |
| 7,474,192 B2 | 1/2009 | Skendzic et al. | |
| 8,208,328 B2 | 6/2012 | Hong | |
| D683,249 S | 5/2013 | McKinley et al. | |
| 8,680,845 B2 * | 3/2014 | Carpenter et al. | 324/156 |
| 2012/0092112 A1 | 4/2012 | McClelland et al. | |
| 2013/0342188 A1 | 12/2013 | McKinley | |
| 2014/0160820 A1 | 6/2014 | McKinley | |
| 2014/0209352 A1 * | 7/2014 | Trittschuh, III | H02G 7/00 174/135 |

* cited by examiner

CLAMP MECHANISM FOR POWER DISTRIBUTION LINE SENSORS

FIELD

The subject matter described herein generally relates to electrical current sensor devices and, more particularly, to mechanisms for hanging, clamping, or otherwise securing electrical current sensors and other electronics upon power distribution lines in AC electrical power grids.

BACKGROUND

Electrical current sensors are frequently installed upon electrical transmission or distribution lines in regional power grids to support power line monitoring and other power management activities. In modern designs, the current sensor electronics, as well as means for communicating with the grid operator and other device components, are contained within a housing that is mounted upon the electrical transmission or distribution line itself, rather than upon substation equipment, a utility tower or pole, or other power grid infrastructure. The mounting mechanism may vary from simple retaining ties (analogous to the well-known 'zip tie') to gated hanger mechanisms (analogous to carabiners) to single-adjustable-jaw and paired-adjustable-jaw clamp mechanisms. With some mounting mechanisms, the current sensor device must be positioned and mounted essentially by hand. With other mounting mechanisms, the device may be positioned and mounted using tools configured to engage portions of the device and mounting mechanism.

Frequently, current sensor devices are installed upon preexisting power distribution lines serving the households, businesses, and infrastructure within a distinct service area. As a result, it is inconvenient, if not practically impossible, to depower the distribution line prior to installing the device. Line workers must manipulate the mounting mechanism while wearing specialized, heavy attire such as insulated gloves and sleeves, or by using insulated stand-off tools such as a so-called 'hot stick.' Current sensor devices incorporating gated hanger mechanisms may be installed using only a hot stick, but these mounting mechanisms tend to be disfavored because they do not secure the device against rotation around the distribution line. Such devices may behave like a pendulum, appearing less 'secure' when buffeted by the wind, requiring more careful consideration concerning positioning (to maintain necessary line-to-line clearances), and requiring more careful design to account for environmental factors such as condensation and drainage from the housing. Current sensor devices incorporating clamp mechanisms, on the other hand, frequently require multiple tools and/or multiple separate manipulative steps (on different portions of the device and mechanism) in order to position, clamp, and, where necessary, close the device during installation. Although some known devices may be positioned and clamped from below using a single stand-off tool, the configuration and orientation of the clamp jaw openings tend to block insertion of a distribution line from below—i.e., to prevent the clamp mechanism from being raised over and then rested upon the distribution line—and/or to allow the clamp mechanism and device to shift or simply fall away from the distribution line absent a positive effort to hold or otherwise bias the clamp mechanism against the distribution line.

SUMMARY

Presented is clamp mechanism for power distribution line sensors which includes a coupling portion manipulable by a hot stick or similar tool from below, which provides an improved capability for inserting a power distribution line from below, and which provides improved stability during installation and prior to the completion of clamping without positive efforts to bias the clamp mechanism against the distribution line. The clamp mechanism may link the portions of the clamshell housing to permit positioning, clamping, and closure via manipulation of the coupling portion alone, or otherwise be combined with the clamshell housing so as to further improve stability during installation.

In a first aspect, a clamp mechanism for a power distribution line sensor includes a drive rod having a first rod portion with a spiral thread formed in a first-handed thread direction, a second rod portion with a spiral thread formed in an opposite-handed thread direction, and a coupling end portion. The mechanism further includes a first clamp portion having a first drive block engaged with the spiral threads of the first rod portion and a first clamp arm having a pin-in-slot connection to the first drive block, as well as a second clamp portion having a second drive block engaged with the spiral threads of the second rod portion and a second clamp arm having a pin-in-slot connection to the second drive block. The first clamp arm and the second clamp arm are secured to each other, yet rotatable with respect to each other, at a proximal end of each respective clamp arm, and provide an adjustable jaw opening between a distal end of each respective clamp arm.

In a second aspect, a clamp mechanism for a power distribution line sensor includes a drive rod having a first rod portion with a spiral thread formed in a first-handed thread direction, a second rod portion with a spiral thread formed in an opposite-handed thread direction, a coupling end portion, and hinge end portion opposite the coupling end portion. The mechanism further includes a first clamp portion having a first drive block engaged with the spiral threads of the first rod portion and a first clamp arm having a pin-in-slot connection to the first drive block, as well as a second clamp portion having a second drive block engaged with the spiral threads of the second rod portion and a second clamp arm having a pin-in-slot connection to the second drive block. The mechanism further includes a clamshell housing having first and second clamshell portions defining an adjustable housing opening adjacent to the coupling end portion and a hinged connection joining the first and second clamshell portions adjacent to the hinge end portion, with the first and second clamp arms being pivotally mounted to the first clamshell portion at a proximal end of each respective clamp arm. The mechanism further includes a link arm pivotably connected to the pin of the pin-in-slot connection of the first clamp arm and having a pin-in-slot connection to the second clamshell portion adjacent to the hinged connection, wherein the adjustable housing opening is adjusted by movement of the first clamp arm during rotational operation of the drive rod.

The clamp mechanism may be combined with a device housing, including but not limited to clamshell housings such that disclosed in U.S. patent application Ser. No. 29/413,300, and is combined with further device electronics, such as the disassociated split sensor coil disclosed in U.S. patent application Ser. No. 13/529,854 and electrical current transformer disclosed in U.S. patent application Ser. No. 13/709,226, to provide a complete distribution-line-mountable sensor device. Each of the aforesaid U.S. Patent Applications are hereby incorporated by reference in their entirety. Several additional features, functions, and advantages may be achieved in various embodiments, examples of which can be seen with reference to the following description and drawings.

BRIEF DESCRIPTION OF THE DRAWINGS

The accompanying figures depict various embodiments of the clamp mechanism. A brief description of each figure is provided below. Spiral threads are indicated only by the labeled representations "LH" and "RH" for sake of clarity.

DETAILED DESCRIPTION

Figure 1:
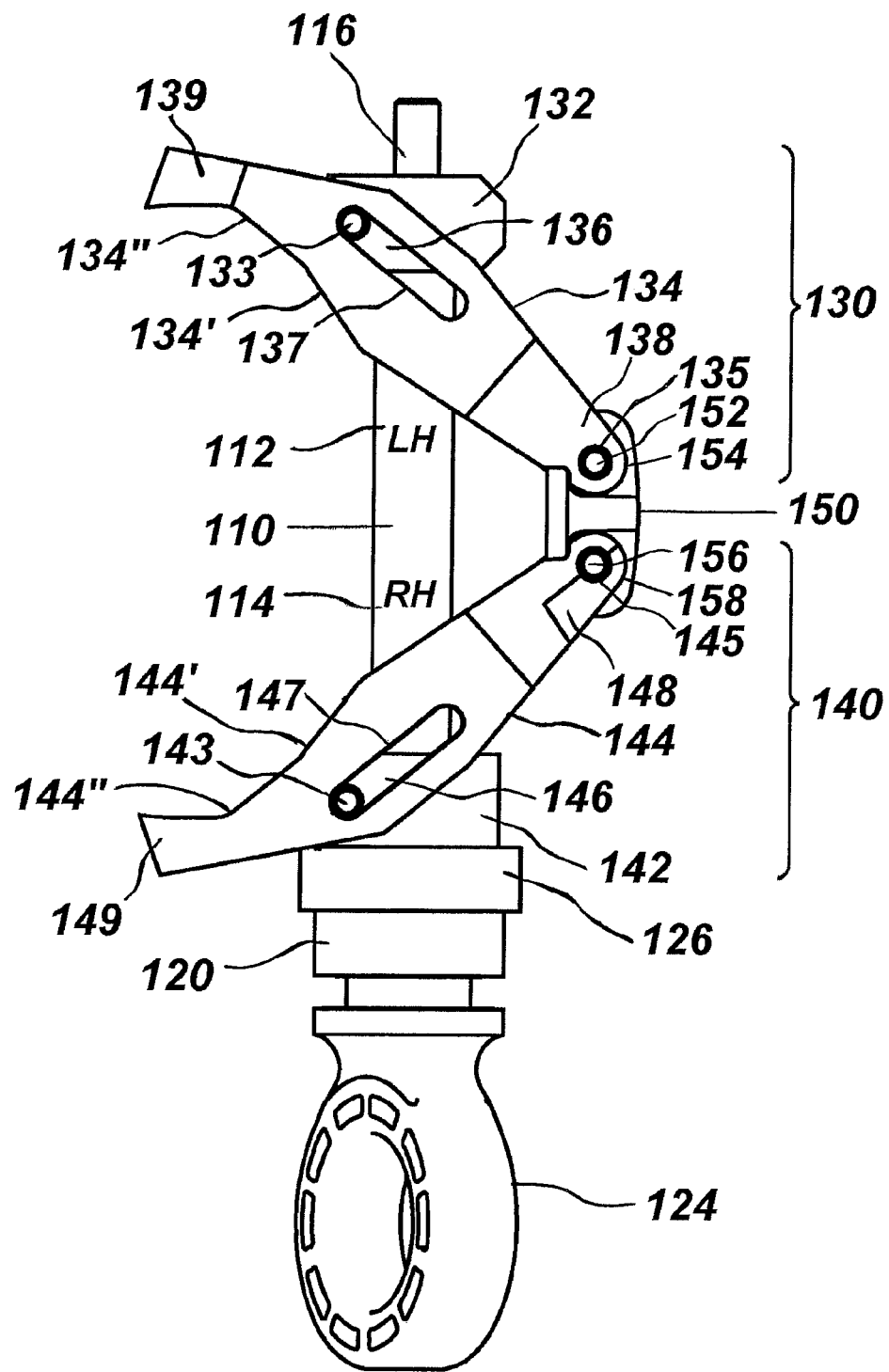
FIG. 1 is a side view of a first embodiment of a clamp mechanism in an open configuration.
Figure 2:
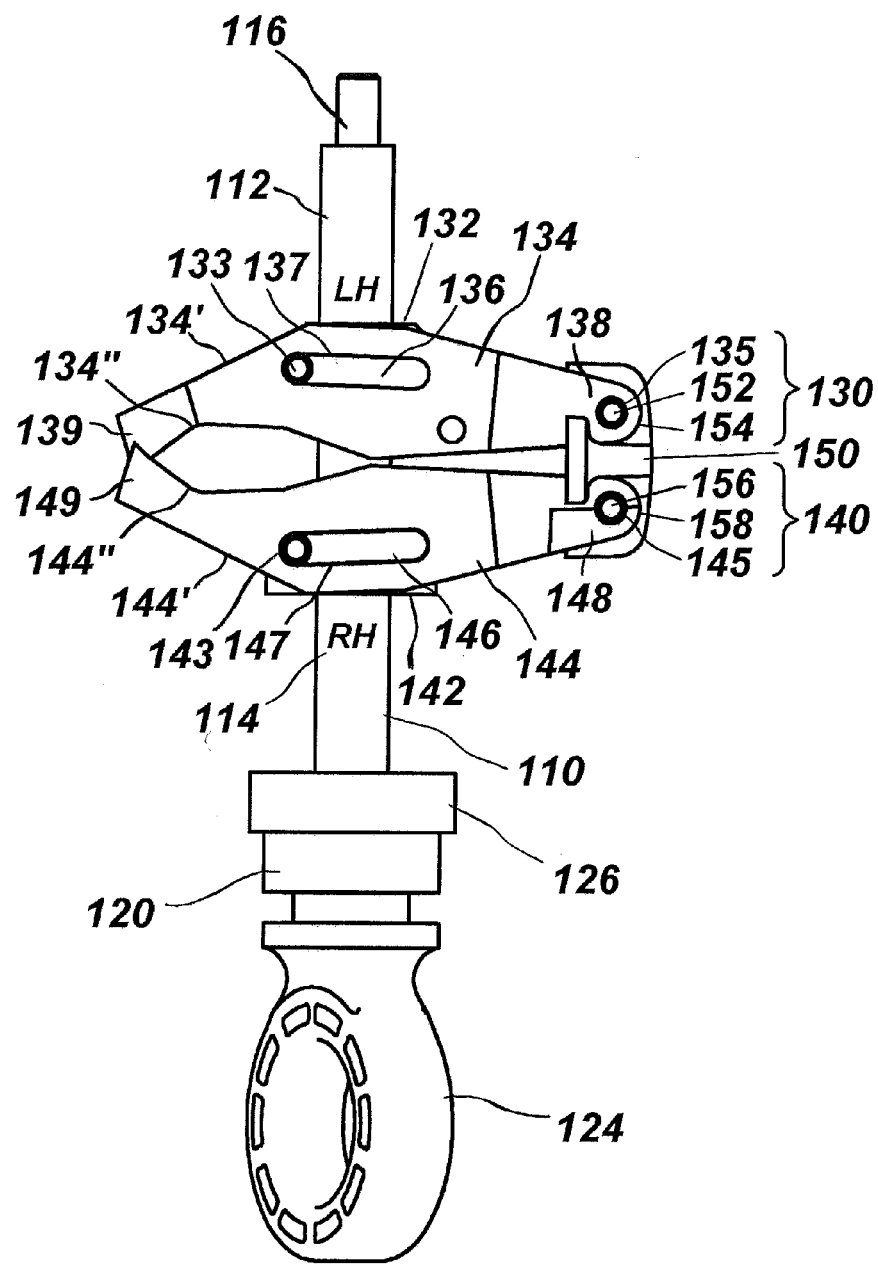
FIG. 2 is a side view of the first embodiment of the clamp mechanism of FIG. 1 in a closed configuration.
Figure 3:
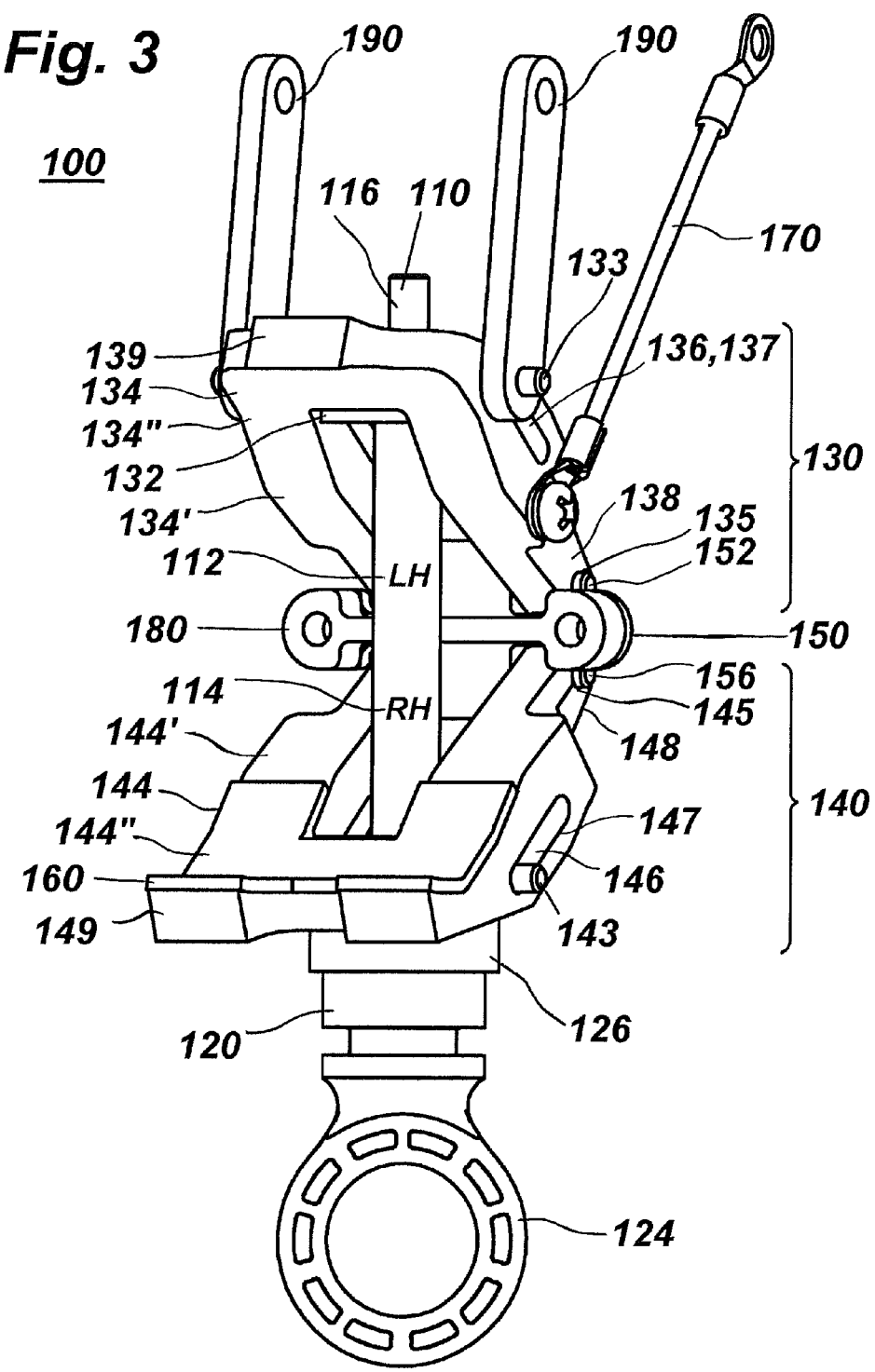
FIG. 3 is an isometric view of a clamp mechanism including a number of optional features.

With initial reference to FIG. 1-3, the present clamp mechanism 100 is based upon a drive rod 110 having a first rod portion 112 with a spiral thread formed in a first-handed thread direction (illustrated as the labeled representation "LH," designating a left-hand threading direction) and a second rod portion 114 with a spiral thread formed in an opposite-handed thread direction (illustrated as the labeled representation "RH," designating a right-hand threading direction; however it will be appreciated that the respective threading directions may be reversed). The drive rod 110 also has a coupling end portion 120 and a hinge end portion 116 opposite the coupling end portion, the term 'hinge end portion' relating to an orientation of the drive rod and non-coupling (i.e., hinge) end portion which is further described below.

The coupling end portion 120 may take any of several forms. In first construction, the coupling end portion 120 may include a drive nut or cap 122 (visible in FIG. 4; hereafter, simply 'drive nut') affixed to the second rod portion 114, e.g., by mutual engagement of a threaded aperture 123 to the spiral threads of the second rod portion, and an drive loop or eye ring 124 (hereafter, simply 'drive loop') affixed to the drive nut 122. The drive nut 122 may be manufactured from metal so as to provide a high strength connection to the drive rod 110, and the drive loop 124 may be manufactured form a non-conductive polymer or polymer composite so as to provide an insulated engagement point for tools such as a hot stick. The drive loop 124 may include an aperture 125 (visible in FIG. 4) which conforms to the drive nut 122 or otherwise is formed around the drive nut. The drive loop 124 may also be reinforced about the drive nut 122 by a drive loop ring 126. Alternately, in a second construction, the coupling portion 120 may include a drive loop 124 directly affixed to the second rod portion 114, e.g., by mutual engagement of a threaded aperture to the spiral threads of the second rod portion. The drive loop 124 may be manufactured from metal, a polymer, a polymer composite, or other materials, depending upon the material strength and insulative properties desired, and similarly may be reinforced about the second rod portion 114 by a drive loop ring 126. Still alternately, in a third construction, the coupling end portion 120 may be formed from or integral with the drive rod 110, and include a forged or cast drive loop 124 integrally affixed to the second rod portion 114. Those of skill will recognize that various other known couplings may be attached to, formed from, or cast in the drive rod 110 such as: square, hexagonal, or otherwise splined shafts; square, hexagonal, or otherwise splined sockets; rotationally asymmetric keyway- and key-bearing couplers, other non-cylindrical shafts, sockets, or projections, etc.

The clamp mechanism 100 also includes a first clamp portion 130 having a first drive block 132 engaged with the spiral threads of the first rod portion 112 and a first clamp arm 134 having a pin-in-slot connection 136 to the first drive block. As shown, the first clamp arm 134 may have slot 137 extending along the first clamp arm between a proximal end 138 and a distal end 139, and the first drive block 132 may have a pin 133 engaged within the slot 137, however those of skill will appreciate that the pin-and-slot connection may be reversed with the first clamp arm having a laterally projecting pin (not shown) and the first drive block 132 having an appropriately directed slot (not shown). The first clamp arm 134 may be at least partially bifurcated proximate the pin-in-slot connection 136 such that the first drive block 132 may be disposed between and within a first bifurcated clamp arm section 134'. The clamp mechanism 100 similarly includes a second clamp portion 140 having a second drive block 142 engaged with the spiral threads of the second rod portion 114 and a second clamp arm 144 having a pin-in-slot connection 146 to the second drive block. A pin 143, slot 147, proximal end 148, distal end 149, and second bifurcated clamp arm section 144' may be provided in the same manner described above with respect to the first clamp potion 130 and its elements.

The first clamp arm 134 and the second clamp arm 144 are secured to each other, yet rotatable with respect to each other, at the proximal end 138, 148 of each respective clamp arm. In a first illustrated embodiment, the first clamp arm 134 and the second clamp arm 144 are secured to each other by a first pivotable connection to a clamp block 150 and a second, adjacent pivotable connection to the clamp block 150, respectively. The first pivotable connection may be a first pivot pin 152 held within a first clamp arm pivot aperture 135 and a corresponding aperture 154 of the clamp block 150, and the second pivotable connection may be a second pivot pin 156 held within a second clamp arm pivot aperture 145 and corresponding aperture 158 of the clamp block 150. However, in a variation the proximal end(s) 138, 148 of each respective clamp may be interleaved, or configured such that the proximal end(s) of one may be disposed between the proximal ends of the other, such that the first clamp arm 134 and the second clamp arm 144 may be secured to each other by the same pivotable connection to the clamp block 150, e.g., by engaging both first clamp arm pivot aperture 135 and second clamp arm pivot aperture 145 with first pivot pin 152 and, indirectly, the corresponding aperture 154 of the clamp block 150. In a further variation, the first and second clamp arms 134, 144 may be secured to each other by at least one pivotable connection to a device housing to similar effect.

The first and second clamp arms 132, 142, due to the pin-in-slot connection 136 to the first drive block 132 and the pin-in-slot connection 146 to the second drive block 142 of the respective clamp portions 130, 140, and due to the mutual securement of the clamp arms 132, 143 via the clamp block 150, provide an adjustable jaw opening between the distal end(s) 139, 149 of each respective clamp arm. More specifically, when clamp block 150 is fixed with respect to a position along the drive rod 110, such as by being secured to a device housing or other device structure, the first clamp arm 134 and second clamp arm 144 are not only movable toward and away from each other along the longitudinal axis of the drive rod 110, but each will cant, at acute angles with respect to planes perpendicular to the longitudinal axis of the drive rod 110, such that the distal ends 139, 149 of the respective clamp arms are drawn closer to drive rod 110 as the first and second drive blocks 132, 142 approach the hinge end portion 116 and coupler end portion 120 of the drive rod. This serves to substantially increase both the width of the adjustable jaw opening and the range of angles (again, with respect to planes perpendicular to the longitudinal axis of the drive rod 110) from which a power distribution line may be inserted from below. As suggested by the background and summary of the disclosure, the clamp mechanism 100 is preferably oriented so that the longitudinal axis of the drive rod 110, in the direction of the coupler end portion 120, is directed toward the ground. Thus a device including the clamp mechanism 100 may be positioned upon and clamped to a power distribution line with a tool engaging the coupler end portion 120, and the second clamp arm 144 has a substantially reduced likelihood of blocking insertion of a power distribution line from below (as illustrated, from the lower left quadrant of FIG. 1).

Figure 4:
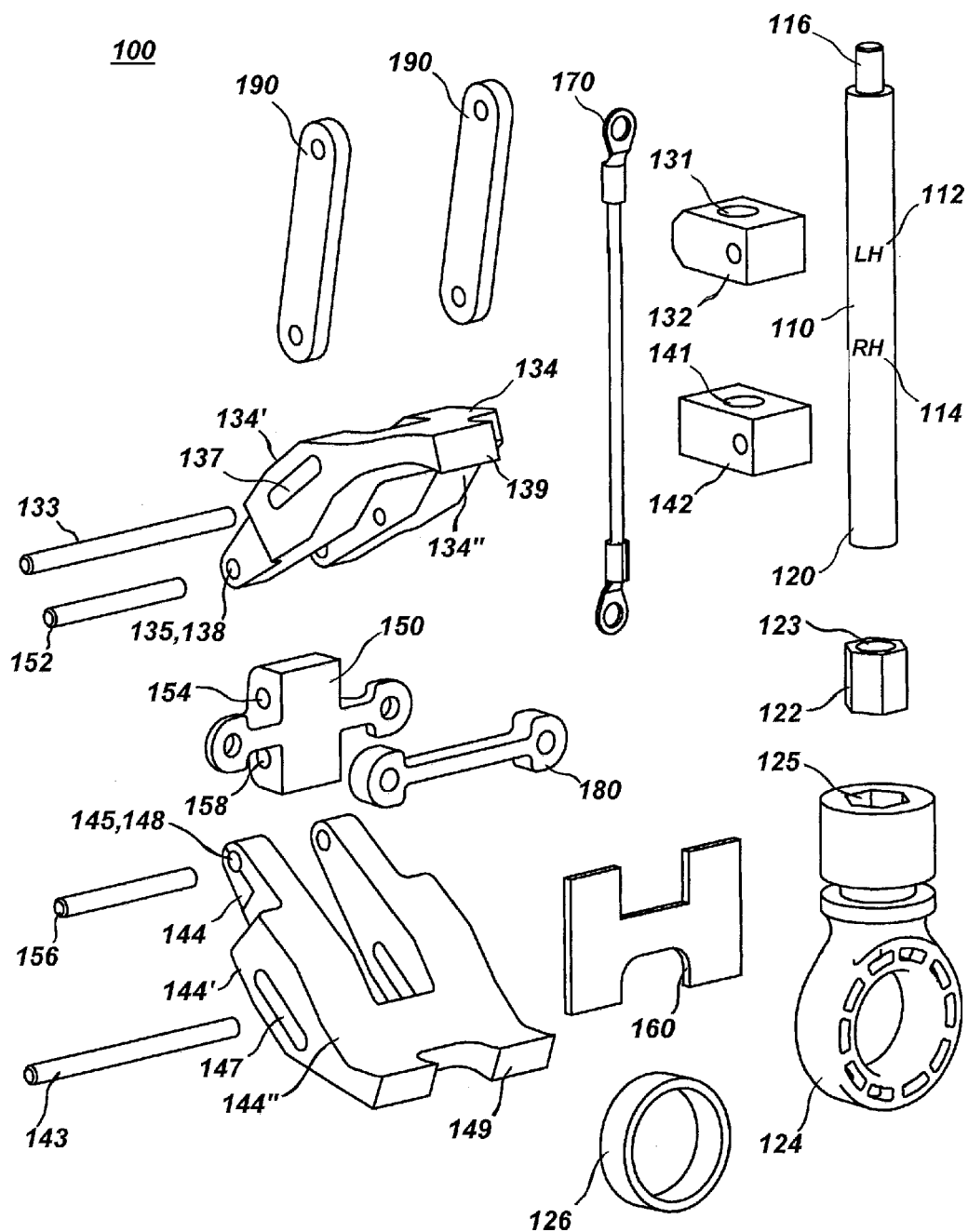
FIG. 4 is an exploded view of the clamp mechanism of FIG. 3.

As shown in FIG. 4, the first and second drive blocks 132, 142 may be provided with apertures 131, 141 which are threaded to engage the spiral threads of the first rod portion 112 and the second rod portion 114, respectively. Due to the opposite threading direction of the spiral threads, the first and second drive blocks 132, 142 will be driven toward and away from each other by operation of the drive rod 110 via coupling end portion 120. However, it will be appreciated that other engagements may be used to produce the same result. For example, the first and second drive blocks may be provided with channels (not shown) in place of apertures. For further example, one or more thread followers (not shown) may project into the aperture or channel in place of the aperture threading. Those of skill will recognize that other variations and structural combinations can create a mechanical engagement between drive blocks 132 and 142 and the spiral threads of the first and second rod portions 112, 114 to cause movement of the drive blocks along the longitudinal axis of the drive rod 110, and are intended to fall within the scope of the recited engagement.

As further shown in FIGS. 1-4, at least the first clamp arm 134 may have generally concave inner surface 134" opposing the second clamp arm 144. The distal end 139 of the first clamp arm 134 may be configured to hook over a power distribution line resting against the concave inner surface 134" when the drive rod is oriented essentially vertically with the coupler end portion 120 disposed below the hinge end portion 116, and with the first and second drive blocks 132, 134 maximally separated along the drive rod 110. This configuration provides improved passive resistance to escapement of the power distribution line from the first clamp arm 134, without requiring a positive effort to hold the first clamp arm against a power distribution line during operation of the coupler end portion 120, and provides an increasing passive resistance to escapement as the first and second drive blocks 132, 142 are drawn together along the drive rod 110. Positive effort in the sense used herein means applying an external force to the device, such as pulling, pushing, or displacing the clamp mechanism, in excess of that required to operate the coupling end portion 120 of the drive rod 110 (and apart from the intrinsic weight of the clamp mechanism 100, device housing, device electronics, etc.). The second clamp arm 144 may also have a generally concave inner surface 144" opposing the first clamp arm 134 in order to provide improved conformance to the outer surface of a power distribution line clamped between the first and second clamp arms.

As shown in FIGS. 3 and 4, the clamp mechanism 100 may optionally include at least one clamp grip 160 disposed on the inner surface of a clamp arm, such as second clamp arm 144, opposing the other clamp arm. The clamp grip 160 may be manufactured from silicone so as to increase friction between the clamp mechanism 100 and a power distribution line clamped between the first and second clamp arms 134, 144. The clamp mechanism 100 may optionally include a conductive equipotentiation strap 170 affixed to a clamp arm 134 or 144 and affixable to a device housing. The equipotentiation strap 170 equalizes the electrical potential of the clamp mechanism 100 and device housing during and after installation of the device upon a power distribution line. The clamp mechanism may optionally include a clamp block reinforcement 180 and/or at least one link arm 190 pivotably connected to the pin 133 of the pin-in-slot connection 136 of the first clamp arm 134. The optional link arm 190 and optional clamp block reinforcement 180 may be mounted to a device housing or other device structure to allow closing of the device housing, in addition to clamping of a power distribution line, by operation of the coupler end portion 120.

Figure 5:
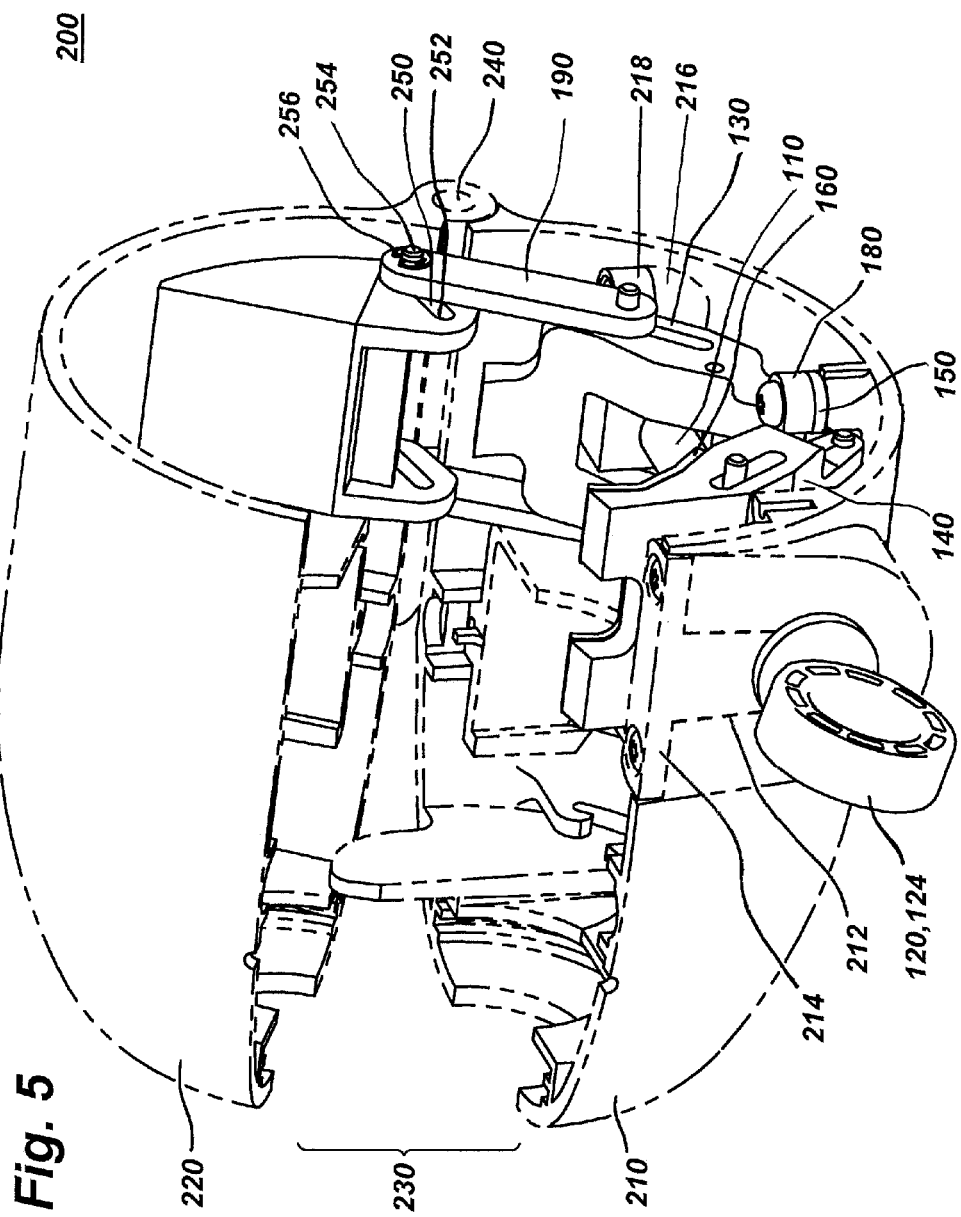
FIG. 5 is a sectional perspective view of a second embodiment of a clamp mechanism including a cooperating clamshell housing. Portions of the cooperating clamshell housing are shown using dashed lines to emphasize the clamp mechanism and specific cooperating housing structure.

In a second embodiment, shown in FIG. 5, a clamp mechanism 200 includes a cooperating clamshell housing. The internal elements of the clamp mechanism may be identical to those described above, and are otherwise labeled with the same reference numbers used in the previous figures. The cooperating clamshell housing has first and second clamshell portions 210, 220 defining an adjustable housing opening 230 adjacent to the coupling end portion 120 of the drive rod 110, and a hinged connection 240 joining the first and second clamshell portions 210, 220 adjacent to the hinge end portion 116 of the drive rod. The coupling end portion 120 is rotatably secured to the first clamshell portion 210 adjacent to the adjustable housing opening 230. The coupling end portion 120 may, for example, be received in a channel 212 in the first clamshell portion 210 which is closed off after insertion of the coupling end portion 120 by a coupling end portion bracket 214. The hinge end portion 116 (not visible in FIG. 5) is rotatably secured to the first clamshell portion 210 adjacent to the hinged connection 240. The hinge end portion may, for example, be received in a cradle portion 216 (partially visible in FIG. 5) which is capped by a retention bracket 216 (also partially visible). The clamp block 150 and any clamp block reinforcement 180 may then be secured against the first clamshell portion, fixing the clamp block 150 with respect to a position along the longitudinal axis of the drive rod 110 and pivotally mounting the first and second clamp arms 134, 144 to the first clamshell portion 210 at a proximal end 138, 148 of each respective clamp arm. As generally indicated above, the first and second clamp arms 134, 144 may alternately be pivotably mounted to the first clamshell portion 210 without an intervening clamp block 150 using one or more pivot apertures provided in the first clamshell portion rather than an intervening clamp block.

The first clamp portion includes at least one link arm 190 in the manner described above. The link arm 190 has pin-in-slot connection 250 to the second clamshell portion 220 adjacent to the hinged connection 240. As shown, the second clamshell portion 220 may have a slot 252, including but not limited to an affixed substructure providing such a slot, extending principally from a point adjacent to the hinged connection 240 toward the adjustable clamshell opening 230. More specifically, the slot 252 may extend from a point adjacent to the hinged connection 240 toward the coupling end portion 120. The link arm may provide or otherwise carry a pin 254 which is engaged within the slot 252. As shown, the pin 254 is carried within an aperture 192 in the link arm 190 and secured by at least one C-clip 256, however the pin could instead be an integral projection of the link arm 190 or a separate pin 254 secured by other fasteners. Those of skill will appreciate that the pin-and-slot connection 250 may be reversed with link arm having an appropriately directed slot (not shown) and the second clamshell portion 220 providing such an integral or secured separate pin 254.

The first clamp portion 130 and the link arm, due to the pin-in-slot connection 250 of the link arm to the second clamshell portion 220, provide an adjustable clamshell opening 230 which is adjustable by operation of the coupling end portion 120 of the drive rod 110. Unclamping or opening of the first and second clamp portions 130, 140 causes the pin-in-slot connection of the link arm 190 to rotate the second clamshell portion 220 away from the first clamshell portion 210 about the hinged connection 240. Clamping of the first and second clamp portions 130, 140 upon a power distribution line, or merely closing the first and second clamp portions, causes the pin-in-slot connection of the link arm 190 to rotate the second clamshell portion 220 toward the first clamshell portion 210 about the hinged connection 240, closing the clamshell housing. Thus, the clam mechanism 200 permits positioning, clamping, and closure via manipulation of the coupling end portion 120 and, in a preferred construction drive loop 124 alone.

It will be understood that any one or more of the embodiments, variations, constructions, and other alternatives presented above may be combined with any one or more of the other embodiments, variations, constructions, and alternatives disclosed herein. It is contemplated that numerous other configurations recombining individual features or elements of the disclosure may be created by taking advantage of the disclosure as a whole. It is thus the applicant's intention that the scope of the patent issuing herefrom will be limited only by the scope of the appended claims.

What is claimed is:

1. A clamp mechanism for a power distribution line sensor, the clamp mechanism comprising:
   a drive rod having a first rod portion with a spiral thread formed in a first-handed thread direction, a second rod portion with a spiral thread formed in an opposite-handed thread direction, and a coupling end portion;
   a first clamp portion having a first drive block engaged with the spiral threads of the first rod portion and a first clamp arm having a pin-in-slot connection, with a first pin slidable within a first elongated slot, to the first drive block; and
   a second clamp portion having a second drive block engaged with the spiral threads of the second rod portion and a second clamp arm having a pin-in-slot connection, with a second pin slidable within a second elongated slot, to the second drive block;
   wherein the first clamp arm and the second clamp arm are secured to each other, yet rotatable with respect to each other, at a proximal end of each respective clamp arm; and
   wherein the first clamp arm and the second clamp arm provide an adjustable jaw opening between a distal end of each respective clamp arm.

2. The clamp mechanism of claim 1, wherein the first drive block includes an aperture threaded to engage the spiral threads of the first rod portion, and the second drive block includes an aperture threaded to engage the spiral threads of the second rod portion.

3. The clamp mechanism of claim 1, wherein the coupler end portion includes a drive loop.

4. The clamp mechanism of claim 3, wherein the coupler end portion includes a drive nut affixed to the second rod portion, and the drive loop is affixed to the drive nut.

5. The clamp mechanism of claim 1, wherein the first clamp arm has the first elongated slot extending along the first clamp arm between a proximal end and a distal end, and the first drive block has the first pin engaged within the first elongated slot.

6. The clamp mechanism of claim 5, wherein the second clamp arm has the second elongated slot extending along the second clamp arm between a proximal end and a distal end, and the second drive block has the second pin engaged within the second elongated slot.

7. The clamp mechanism of claim 1, wherein the first clamp arm is at least partially bifurcated proximate the pin-in-slot connection to the first drive block with the first drive block being disposed between and within a first bifurcated clamp arm section.

8. The clamp mechanism of claim 7, wherein the second clamp arm is at least partially bifurcated proximate the pin-in-slot connection to the second drive block with the second drive block being disposed between and within a second bifurcated clamp arm section.

9. The clamp mechanism of claim 1, wherein the first clamp arm and the second clamp arm are secured to each other by at least one pivotable connection to a clamp block.

10. The clamp mechanism of claim 9, wherein the pivotable connection comprises a first pivot pin held within a first clamp arm pivot aperture of the first clamp arm and within a corresponding aperture of the clamp block.

11. A clamp mechanism for a power distribution line sensor, the clamp mechanism comprising:
    a drive rod having a first rod portion with a spiral thread formed in a first-handed thread direction, a second rod portion with a spiral thread formed in an opposite-handed thread direction, and a coupling end portion;
    a first clamp portion having a first drive block engaged with the spiral threads of the first rod portion and a first clamp arm having a pin-in-slot connection, with a first pin slidable within a first elongated slot, to the first drive block;
    a second clamp portion having a second drive block engaged with the spiral threads of the second rod portion and a second clamp arm having a pin-in-slot connection, with a second pin slidable within a second elongated slot, to the second drive block; and
    a clamshell housing having first and second clamshell portions defining an adjustable housing opening adjacent to the coupling end portion and a hinged connection joining the first and second clamshell portions adjacent to the hinge end portion, wherein the first and second clamp arms are pivotally connected to the first clamshell portion at a proximal end of each respective clamp arm; and
    a link arm pivotably connected to the pin of the pin-in-slot connection of the first clamp arm and having a pin-in-slot connection to the second clamshell portion adjacent to the hinged connection;
    wherein the adjustable housing opening is adjusted by movement of the first clamp arm during rotational operation of the drive rod via the coupling end portion.

12. The clamp mechanism of claim 11, wherein the coupling end portion is rotatably secured to the first clamshell portion adjacent to the adjustable housing opening, and the hinge end portion is rotatably secured to the first clamshell portion adjacent to the hinged connection.

13. The clamp mechanism of claim 11, wherein the first clamp arm and the second clamp arm are pivotably connected to the first clamshell portion through a clamp block, and the clamp block secured against the first clamshell portion so as to fix the clamp block with respect to a position along the longitudinal axis of the drive rod.

14. The clamp mechanism of claim 11, wherein the pivotable connection of the first and second clamp arms to the first clamshell portion comprises a first pivot pin held within a first clamp arm pivot aperture of the first clamp arm and within a corresponding aperture of the clamp block.

15. The clamp mechanism of claim 11, wherein for the pin-in-slot connection to the second clamshell portion, the second clamshell portion has a slot extending principally from a point adjacent to the hinged connection toward the adjustable clamshell opening, and the link arm includes a pin which is engaged within the slot.

16. The clamp mechanism of claim 15, wherein the slot extends from the point adjacent to the hinged connection toward the coupling end portion.

17. The clamp mechanism of claim 11, wherein the first clamp arm has the slongated first slot extending along the first clamp arm between a proximal end and a distal end, and the first drive block has the first pin engaged within the first elongated slot.

18. The clamp mechanism of claim 17, wherein the second clamp arm has the second elongated slot extending along the second clamp arm between a proximal end and a distal end, and the second drive block has the second pin engaged within the second elongated slot.

19. The clamp mechanism of claim 11, wherein the first clamp arm is at least partially bifurcated proximate the pin-in-slot connection to the first drive block with the first drive block being disposed between and within a first bifurcated clamp arm section.

20. The clamp mechanism of claim 7, wherein the second clamp arm is at least partially bifurcated proximate the pin-in-slot connection to the second drive block with the second drive block being disposed between and within a second bifurcated clamp arm section.

* * * * *